US012776778B2

(12) United States Patent
Costa Beber Vieira et al.

(10) Patent No.: US 12,776,778 B2
(45) Date of Patent: Oct. 27, 2026

(54) LEVEL SHIFTER FOR POWER CONVERTERS

(71) Applicant: Infineon Technologies Austria AG, Villach (AT)

(72) Inventors: Filipe Costa Beber Vieira, Villach (AT); Oleg Vitrenko, Villach (AT); Arnaud Philippe Albert Perroy, Villach (AT)

(73) Assignee: Infineon Technologies Austria AG, Villach (AT)

( * ) Notice: Subject to any disclaimer, the term of this patent is extended or adjusted under 35 U.S.C. 154(b) by 148 days.

(21) Appl. No.: 18/949,134

(22) Filed: Nov. 15, 2024

(65) Prior Publication Data

US 2026/0142661 A1 May 21, 2026

(51) Int. Cl.

| | |
|---|---|
| ***H03K 19/0185*** | (2006.01) |
| ***H02M 1/096*** | (2006.01) |
| ***H02M 3/158*** | (2006.01) |

(52) U.S. Cl.

CPC .... *H03K 19/018528* (2013.01); *H02M 1/096* (2013.01); *H02M 3/158* (2013.01)

(58) Field of Classification Search

None

See application file for complete search history.

(56) References Cited

U.S. PATENT DOCUMENTS

| | | | |
|---|---|---|---|
| 4,692,641 | A | 9/1987 | Highton |
| 4,945,265 | A | 7/1990 | Estrada |
| 6,211,706 | B1 | 4/2001 | Choi et al. |
| 7,893,730 | B2 | 2/2011 | Jung et al. |
| 8,598,936 | B2 | 12/2013 | Kuge |
| 9,722,610 | B2 | 8/2017 | Akahane |
| 9,979,397 | B1 | 5/2018 | Zhu et al. |
| 10,193,554 | B1 | 1/2019 | Sharma et al. |

(Continued)

OTHER PUBLICATIONS

R. S. Ashwin Kumar et. al, Flip-Around Level-Shifting For Switched-Capacitor Amplifiers to Improve the Closed-Loop Settling of Floating-Inverter Amplifiers, May 2024, 2024 IEEE International Symposium on Circuits and Systems (ISCAS) (Year: 2024).*

(Continued)

*Primary Examiner* — Crystal L Hammond
*Assistant Examiner* — Seung Ho Choi
(74) *Attorney, Agent, or Firm* — Murphy, Bilak & Homiller, PLLC

(57) ABSTRACT

A level shifter for a power converter includes: a differential detector; a first transistor having a drain electrically connected to a first node of the differential detector, a gate, and a source; a second transistor having a drain electrically connected to a second node of the differential detector, a gate, and a source; and a circuit configured to simultaneously apply a same voltage to the source of the first and the second transistors based on a digital signal input to the level shifter. The circuit is also configured to apply a different gate voltage depending on the input digital signal, to choose which side of the level shifter will draw current to the differential detector. The differential detector is configured to translate the digital signal to a different voltage level based on a differential current between the first and the second transistors.

20 Claims, 10 Drawing Sheets

(56) References Cited

U.S. PATENT DOCUMENTS

| | | | |
|---|---|---|---|
| 10,483,977 | B1 | 11/2019 | Berwick et al. |
| 10,536,140 | B1 | 1/2020 | Ribarich et al. |
| 10,749,509 | B1 | 8/2020 | Cascio et al. |
| 10,868,536 | B1 | 12/2020 | Ke et al. |
| 11,183,835 | B2 | 11/2021 | Lee et al. |
| 11,606,031 | B1 | 3/2023 | Oporta et al. |
| 11,942,942 | B1 | 3/2024 | Chan et al. |
| 12,362,752 | B2 | 7/2025 | Lam |
| 2002/0105311 | A1 | 8/2002 | Rutter et al. |
| 2005/0122754 | A1 | 6/2005 | Nielsen |
| 2012/0229165 | A1 | 9/2012 | Tseng et al. |
| 2014/0152369 | A1* | 6/2014 | Qi |
| 2016/0277008 | A1 | 9/2016 | Green et al. |
| 2017/0110971 | A1 | 4/2017 | Degen et al. |
| 2018/0034466 | A1 | 2/2018 | Zhang et al. |
| 2018/0302072 | A1 | 10/2018 | Abesingha et al. |
| 2019/0140635 | A1 | 5/2019 | Abesingha et al. |
| 2020/0018782 | A1 | 1/2020 | Gupta et al. |
| 2020/0044648 | A1 | 2/2020 | Sharma et al. |
| 2020/0162074 | A1 | 5/2020 | Niikura |
| 2020/0382122 | A1 | 12/2020 | Niikura |
| 2021/0218389 | A1 | 7/2021 | Rajalakshmi et al. |
| 2021/0351686 | A1 | 11/2021 | Bognanni et al. |
| 2022/0103162 | A1 | 3/2022 | Shuvalov |
| 2022/0302839 | A1 | 9/2022 | Ishino |
| 2024/0106318 | A1 | 3/2024 | Kwak et al. |
| 2025/0175179 | A1 | 5/2025 | Hsu et al. |
| 2025/0211231 | A1 | 6/2025 | Lin |

OTHER PUBLICATIONS

A. Salimath et. al, A high-speed level shifting technique and its application in high-voltage, synchronous DC-DC converters with quasi-ZVS, May 2017, 2017 IEEE International Symposium on Circuits and Systems (ISCAS) (Year: 2017).*

Costa Beber Vieira, Filipe, et al., "Level Shifter for Power Converters", U.S. Appl. No. 18/475,341, filed Sep. 27, 2023, pp. 1-49.

Hsu, Ching Tiu, et al., "Level Shifter Having a Cross-Coupled Current Mirror Circuit for Reducing or Cancelling Common Mode Slew Current", U.S. Appl. No. 18/523,125, filed Nov. 29, 2023, pp. 1-28.

Quaglino, Roberto, et al., "Level Shifter for Power Electronics Circuits", U.S. Appl. No. 18/600,823, filed Mar. 11, 2024, pp. 1-34.

* cited by examiner

LEVEL SHIFTER FOR POWER CONVERTERS

BACKGROUND

Power converters such as half and full bridge converters typically use a bootstrap technique which includes a bootstrap capacitor to create a floating voltage domain to drive one or more high-side power switches of the power converter. In a typical application of a DC-DC buck converter, in the time interval between when the high-side power switch is active and the low-side power switch is active, there is dead time when all of the power switches are off. During the dead time, the output inductor forces a current to flow, and as a consequence, the switching node of the power converter is forced to a negative value. If silicon transistors are used to implement the power switches, the low-side power switch has a parasitic/body diode in place, and the negative voltage at the switching node is around −0.7V. If a GaN transistor(s) (or gallium nitride high-electron-mobility transistors—GaN HEMTs) is used to implement the low-side power switch, the low-side power switch does not have a body diode but can conduct current if the voltage between the drain and gate creates a channel. In this case, the switching node of the power converter is forced to a more negative voltage such as in a range of −2V to −5V. Due to the existence of the bootstrap capacitor, the bootstrap node, which is the positive supply voltage of the high side driver, follows the switching node of the power converter, falling to a level close to ground. To leave the dead time mode, the input control of high side driver toggles, sending a signal from the low-voltage input domain to the high side domain through a level shifter, and finally toggling the driver for the high-side power switch. Since the switching node of the power converter and the low-voltage input domain are both close to 0V in this case, there is not enough headroom voltage for the standard architectures of level shifter to propagate the current signal.

Thus, there is a need for a level shifter design with improved voltage headroom for power converter applications.

SUMMARY

According to an embodiment of a level shifter, the level shifter comprises: a differential detector; a first transistor having a drain electrically connected to a first node of the differential detector, a gate, and a source; a second transistor having a drain electrically connected to a second node of the differential detector, a gate, and a source; and a circuit configured to simultaneously apply a same voltage to the source of the first and the second transistors based on a digital signal input to the level shifter, wherein the differential detector is configured to translate the digital signal to a different voltage level based on a differential current between the first and the second transistors.

According to another embodiment of a level shifter, the level shifter comprises: a differential detector; a first transistor having a drain electrically connected to a first node of the differential detector, a gate, and a source; a second transistor having a drain electrically connected to a second node of the differential detector, a gate, and a source; a common capacitor having a first terminal and a second terminal; a first switch device electrically connected between a first DC supply voltage or a local ground reference and the first terminal of the common capacitor; a second switch device electrically connected between the first terminal of the common capacitor and ground or a bootstrap node; and a third switch device electrically connected between the second terminal of the common capacitor and ground or the bootstrap node, wherein the second terminal of the common capacitor is electrically connected to the source of the first and the second transistors.

According to an embodiment of a power converter, the power converter comprises: a high-side power switch device; a gate driver configured to drive a gate of the high-side power switch device; and a level shifter. The level shifter comprises: a differential detector; a first transistor having a drain electrically connected to a first node of the differential detector, a gate, and a source; a second transistor having a drain electrically connected to a second node of the differential detector, a gate, and a source; and a circuit configured to simultaneously apply a same voltage to the source of the first and the second transistors based on a digital signal input to the level shifter, wherein the differential detector is configured to translate the digital signal to a voltage domain of the gate driver based on a differential current between the first transistor and the second transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a level shifter having improved voltage headroom. The level shifter may be used in power converter applications such as half and full bridge converters. The level shifter uses high-voltage transistors and a differential circuit for sending digital information from a low-side domain to a high-side domain. The high-voltage transistors are controlled at their source terminals and not at their gate terminals. The gate terminals of the high-voltage transistors are connected to ground or to a DC voltage, e.g., close to ground. The same voltage is simultaneously applied to the source of the high-voltage transistors, where the applied source voltage corresponds to the low or high level of the input digital signal. The gates of the high voltage transistors are controlled separately to set different Vgs (gate-to-source voltage) for both high voltage devices.

For example, a common capacitor and a common switch network may be used to simultaneously apply the same voltage to the source of the high-voltage transistors. In response to a transition in the digital signal, the common switch network may connect the common capacitor to the source of the high-voltage transistors such that a negative voltage is applied to the source of the transistors at the same time. After a transition in the digital signal, the common switch network may then pre-charge the common capacitor for the next transition in the digital signal. In another example, a common diode may be part of the circuit that simultaneously applies the same voltage to the source of the high-voltage transistors. Using common components such as a common capacitor and a common switch network and/or a common diode to simultaneously apply the same voltage to the source of the high-voltage transistors reduces component count and size, shares the high voltage isolation, and eliminates the need for an additional high voltage device.

Described next, with reference to the figures, are exemplary embodiments of the level shifter and power converters that use the level shifter.

Figure 1A:
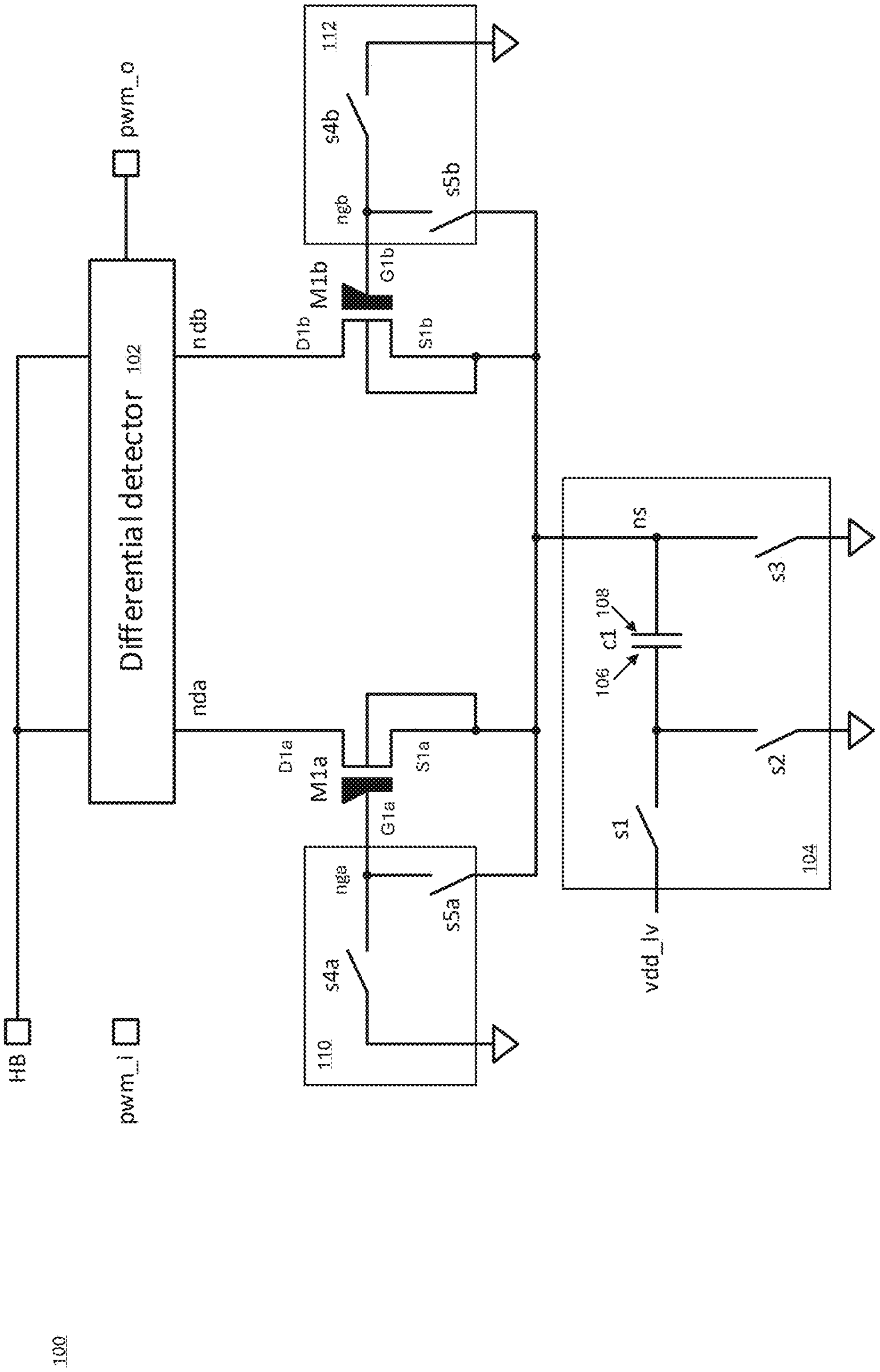
FIG. 1A illustrates a circuit schematic of a level-up shifter, according to an embodiment.

FIG. 1A illustrates a circuit schematic of a level shifter 100, according to an embodiment. The level shifter 100 includes a differential detector 102, a first (high voltage) transistor M1_a_ having a drain D1_a_ electrically connected to a first node nda of the differential detector 102, and a second (high voltage) transistor M1_b_ having a drain D1_b_ electrically connected to a second node ndb of the differential detector 102. The gate G1_a_ of the first transistor M1_a_ is electrically connected to ground or a fixed DC voltage vb. The gate G1_b_ of the second transistor M1_b_ also is electrically connected to ground or a fixed DC voltage vb. The fixed DC voltage vb may be the same or different for the first and second transistors M1_a_, M1_b_.

The level shifter 100 also includes a circuit 104 that simultaneously applies the same voltage vdd_lv to the source S1_a_, S1_b_ of the first and the second transistors M1_a_, M1_b_ based on a digital signal pwm_i input to the level shifter 100. The differential detector 102 translates the digital input signal pwm_i to a different voltage level pwm_o based on a differential current between the first transistor M1_a_ and the second transistor M1_b_. The first and second transistors M1_a_, M1_b_ have short pull down current pulses. The differential detector 102 detects the difference and generates a pulse which is latched so that pulse remains active until the next cycle. This allows for quick turn off of the first transistor M1_a_ (or the second transistor M1_b_), reducing power losses and relaxing reliability requirements for these transistors.

In FIG. 1A, the circuit 104 includes a common capacitor c1 and a common switch network s1-s3. The capacitor c1 and the switch network s1-s3 are 'common' in that the same capacitor c1 and the same switch network are used to applies a voltage vdd_lv to the source S1_a_, S1_b_ of the first and the second transistors M1_a_, M1_b_. The common capacitor/switch network circuit configuration shown in FIG. 1A enables simultaneous application of the same voltage vdd_lv to the source S1_a_, S1_b_ of the first and the second transistors M1_a_ M1_b_, based on the digital signal pwm_i input to the level shifter 100. Accordingly, separate capacitors and separate switch networks are not required to adequately bias the source S1_a_, S1_b_ of the first and the second transistors M1_a_, M1_b_. Also, switch devices s4_a_, s5_a_, s4_b_ and s5_b_ determine which high voltage transistor M1_a_, M1_b_ will keep Vgs equal to 0V and which high voltage transistor M1_a_, M1_b_ will keep a high Vgs to send a signal.

In response to a transition in the digital signal pwm_i input to the level shifter 100, the common switch network s1-s3 connects the common capacitor c1 to the source of the first and the second transistors such that a negative voltage is applied to the source S1_a_, S1_b_ of the first and the second transistors M1_a_, M1_b_ at the same time. Also at the same time, the common switch network s1-s3 selects the gate G1_a_, G1_b_ of one of the first and the second transistors M1_a_, M1_b_ to be shorted to the common source (node ns) while keeping the other gate G1_b_, G1_a_ grounded, such that one of the high voltage transistors M1_a_, M1_b_ has Vgs=0V and the other high voltage transistor M1_b_, M1_a_ has Vgs=3V. After the transition in the digital input signal pwm_i, the common switch network s1-s3 pre-charges the common capacitor c1 for the next transition in the digital input signal pwm_i.

In FIG. 1A, the common switch network s1-s3 includes a first switch device s1 electrically connected between a first DC supply voltage or a local ground reference vdd_lv and a first terminal 106 of the common capacitor c1, a second switch device s2 electrically connected between the first terminal 106 of the common capacitor c1 and ground or a bootstrap node HB, and a third switch device s3 electrically connected between a second terminal 108 of the common capacitor c1 and ground or the bootstrap node HB. The second terminal 108 of the common capacitor c1 is electrically connected to the source S1_a_, S1_b_ of the first and the second transistors M1_a_, M1_b_.

The second switch device s2 turns on in response to a transition in the digital signal pwm_i input to the level shifter 100. The first switch device s1 and the third switch device s3 are both off when the second switch device s2 is on. In this (first) state, the voltage across the common capacitor c1 is simultaneously applied to the source S1_a_, S1_b_ of the first and the second transistors M1_a_, M1_b_. The second switch device s2 turns off after a predefined time from the transition in the digital input signal pwm_i. The first switch device s1 and the third switch device s3 are both on when the second switch device s2 is off. In this (second) state, the common capacitor c1 pre-charges to vdd_lv for the next transition in the digital input signal pwm_i.

In FIG. 1A, the level shifter 100 is an up-level shifter meaning that the level shifter 100 translates the digital signal pwm_i input to the level sifter 100 to a higher voltage level. In the up level shifter case, the differential detector 102 is coupled between a bootstrap node HB and the first and the second transistors M1_a_, M1_b_, the first and the second transistors M1_a_, M1_b_ are NMOS (n-channel metal-oxide-semiconductor) devices coupled between the differential detector 102 and ground, and the differential detector 102 translates the digital input signal pwm_i to a higher voltage level based on the differential current between the first transistor M1_a_ and the second transistor M1_b_.

The level shifter 100 in FIG. 1A is differential, with the operation of the left and right sides being complementary to one another. The switch devices s1, s2, s3 of the common switch network s1-s3 are used to control node ns, which controls the current of both the first transistor M1_a_ and the current of the second transistor M1*b*. Hence, the same switch network s1-s3 controls the current in both sides of the level shifter 100.

In a non-switching state condition, the third switch device s3 is on, ensuring node ns is connected to the GND, and the transistors M1*a* and M1*b* are off. During this state, the first switch device s1 also is on, charging the common capacitor c1 with the voltage difference of vdd_lv to GND. To enable charging of the common capacitor c1, the second switch device s2 is kept off. Since transistors M1*a* and M1*b* are both off in this state, the differential detector 102 is latched to the last state level.

For latching the differential detector 102 to a first position, the left side of the level shifter 100 is used. For latching the differential detector 102 to a second position, the right side of the level shifter 100 is used. Since the same voltage is simultaneously applied to the source S1*a*, S1*b* of the first and the second transistors M1*a* M1*b* via the common capacitor c1 and the common switch network s1-s3 in FIG. 1A, the level shifter 100 also includes a first switch network 110 that controls the electric potential at the gate G1*a* of the first transistor M1*a* and a second switch network 112 that controls the electric potential at the gate G1*b* of the second transistor M1*b*. The separate gate potential switch networks 110, 112 enable latching of the differential detector 102 to either position.

The first gate potential switch network 110 includes a first switch device s4*a* electrically connected between ground and the gate G1*a* of the first transistor M1*a*, at node nga. The first gate potential switch network 110 also includes a second switch device s5*a* electrically connected between the gate G1*a* and the source S1*a* of the first transistor M1*a*. The second gate potential switch network 112 similarly includes a third switch device s4*b* electrically connected between ground and the gate G1*b* of the second transistor M1*b*, at node ngb, and a fourth switch device s5*b* electrically connected between the gate G1*b* and the source S1*b* of the second transistor M1*b*.

Figure 1B:
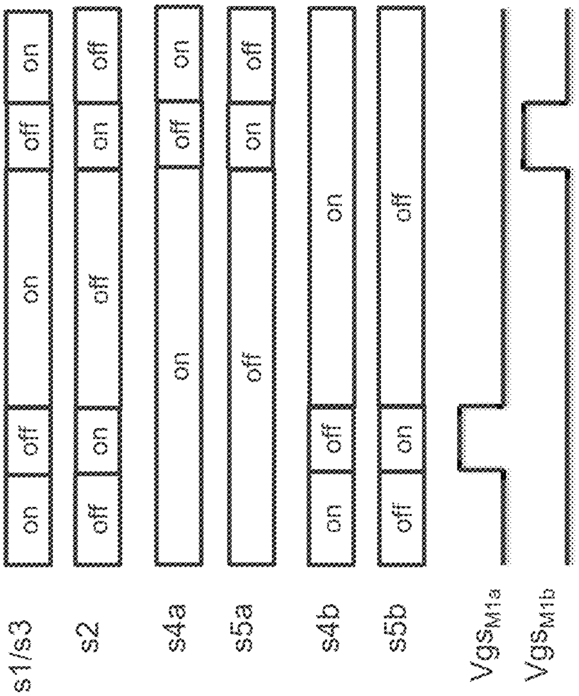
FIG. 1B illustrates the on/off states of various switch devices included in the level-up shifter and the gate-to-source voltage (Vgs) of the high voltage transistors included in the level-up shifter, during operation of the level-up shifter.

The first gate potential switch network 110 can be used to connect the gate G1*a* of the first transistor M1*a* to ground or close to ground potential, by closing switch device s4*a* and opening switch device s5*a*, such that there is a voltage difference between the gate-to-source voltage (VGS) and the drain-to-source voltage (VDS) of the first transistor M1*a*, which draws current into the first (left) node nda of the differential detector 102. The second gate potential switch network 112 can be used to disconnect the gate G1*b* of the second transistor M1*b* from ground, by opening switch device s4*b* and closing switch device s5*b*, such that there is little or no voltage difference between the gate-to-source voltage and the drain-to-source voltage of the second transistor M1*b*, and therefore no current is drawn into the second (right) node ndb of the differential detector 102. FIG. 1B illustrates the on/off states of the switch devices s1, s2, s3 of the common switch network s1-s3 and the switch devices s4*a*, s5*a*, s4*b*, s5*b* of the gate potential switch networks 110, 112, and the Vgs of the first and second high voltage transistors M1*a*, M1*b*, during operation of the level shifter 100.

The differential detector 102 detects that current is flowing in the left side (from transistor M1*a*) and no current is flowing in the right side (from transistor M1*b*), and in response toggles the output pwm_o of the level shifter 100 from low to high (or high to low). The current flowing in the first transistor M1*a* is provided by the common capacitor c1, which, e.g., may be turned on for just a few nanoseconds (turn-on time needs to be slightly higher than the propagation delay of the level shifter 100). After a predefined time, the first gate potential switch network 110 disconnects the gate G1*a* of the first transistor M1*a* from ground, by opening switch devices s4*a* and s5*a*. As there is no difference in current between the first and second transistors M1*a* and M1*b* in this state, the output of the differential detector 102 is latched.

For latching the differential detector 102 to the opposite position, the second gate potential switch network 112 can be used to connect the gate G1*b* of the second transistor M1*b* to ground or close to ground potential, by closing switch device s4*b* and opening switch device s5*b*, such that there is a voltage difference between the gate-to-source voltage and the drain-to-source voltage of the second transistor M1*b*, which draws current into the second (right) node ndb of the differential detector 102. The first gate potential switch network 110 can be used to disconnect the gate G1*a* of the first transistor M1*a* from ground, by opening switch device s4*a* and closing switch device s5*a*, such that there is little or no voltage difference between the gate-to-source voltage and the drain-to-source voltage of the first transistor M1*a*, and therefore no current is drawn into the first (left) node nda of the differential detector 102.

The differential detector 102 detects that current is flowing in the right side (from transistor M1*b*) and no current is flowing in the left side (from transistor M1*a*), and in response toggles the output pwm_o of the level shifter 100 from high to low (or low to high). The current flowing in the second transistor M1*b* is provided by the common capacitor c1, which, as explained above, may be turned on for just a few nanoseconds (turn-on time needs to be slightly higher than the propagation delay of the level shifter 100). After a predefined time, the second gate potential switch network 112 disconnects the gate G1*b* of the second transistor M1*b* from ground, by opening switch devices s4*b* and s5*b*. As there is no difference in current between the second and first transistors M1*b* and M1*a* in this state, the output of the differential detector 102 is again latched. The size of the common capacitor c1 should be designed to ensure a small discharge during the time the respective high voltage transistors M1*a*, M1*b* are on.

Figure 2:
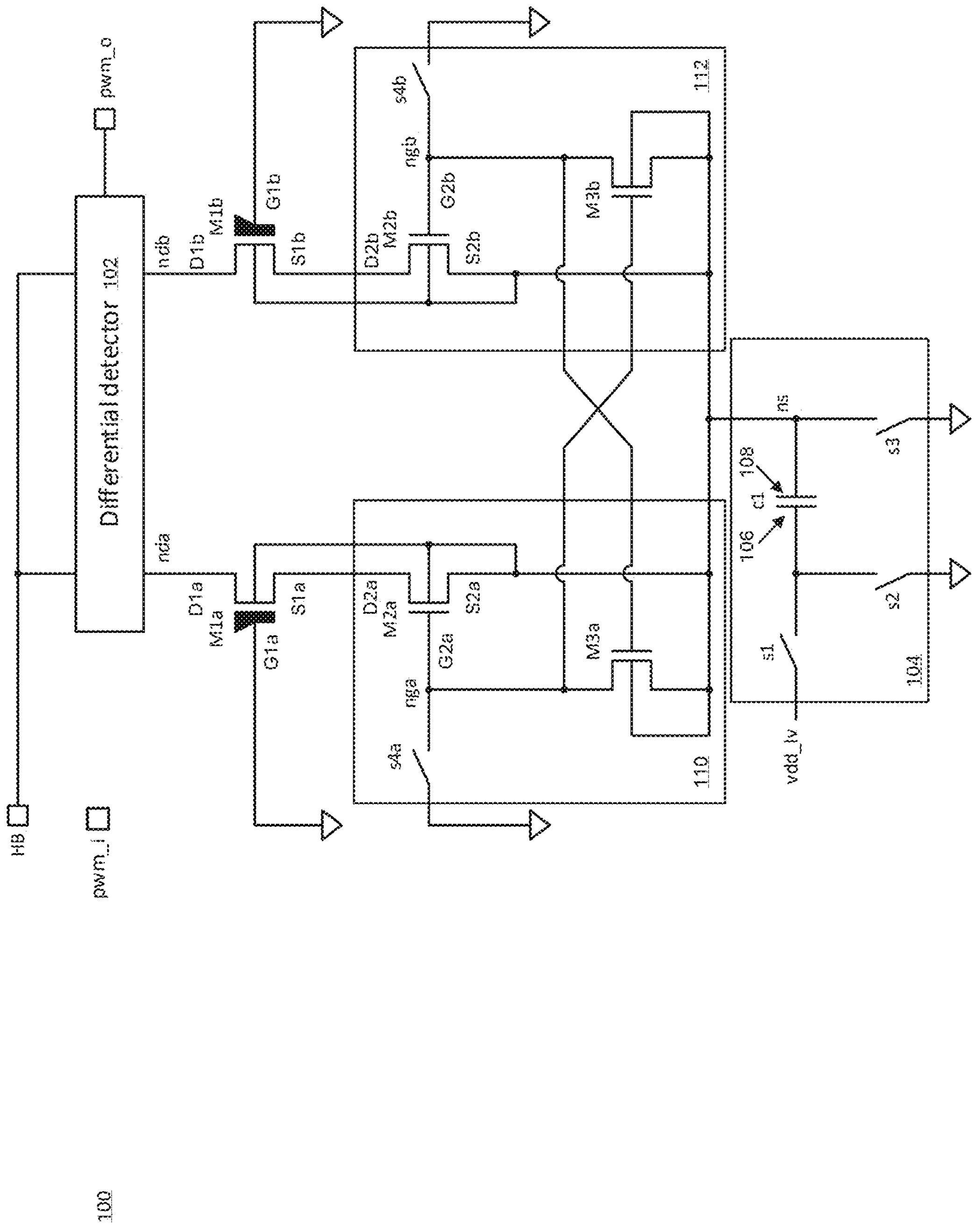
FIG. 2 illustrates a circuit schematic of a level-up shifter, according to another embodiment.

FIG. 2 illustrates a circuit schematic of the level shifter 100, according to another embodiment. The level shifter 100 in FIG. 2 is similar to the level shifter 100 in FIG. 1A. In FIG. 2, the level shifter 100 further includes a first additional switch device M2*a* electrically connected between the source S1*a* of the first transistor M1*a* and the common capacitor c1, and a second additional switch device M2*b* electrically connected between the source S1*b* of the second transistor M1*b* and the common capacitor c1. The additional switch devices M2*a*, M2*b* are NMOS devices in this embodiment and may have a lower voltage rating than the first and second (main) transistors M1*a*, M1*b*. Also, the second switch device s5*a* of the first gate potential switch network 110 and the second switch device s5*b* of the second gate potential switch network 112 are implemented as a pair of cross-coupled NMOS devices M3*a*, M3*b* in FIG. 2. The drain D2*a* of the first additional switch device M2*a* is electrically connected to the source S1*a* of the first transistor M1*a*, the source S2*a* of the first additional switch device M2*a* is electrically connected to the common node ns of the circuit 104, and the gate G2*a* of the first additional switch device M2*a* is electrically connected to node nga of the first gate potential switch network 110. The drain D2*b* of the second additional switch device M2*b* is electrically connected to the source S1*b* of the second transistor M1*b*, the source S2*b* of the second additional switch device M2*b* is electrically connected to the common node ns of the circuit 104, and the gate G2*b* of the second additional switch device M2*b* is electrically connected to node ngb of the second gate potential switch network 112.

Figure 3:
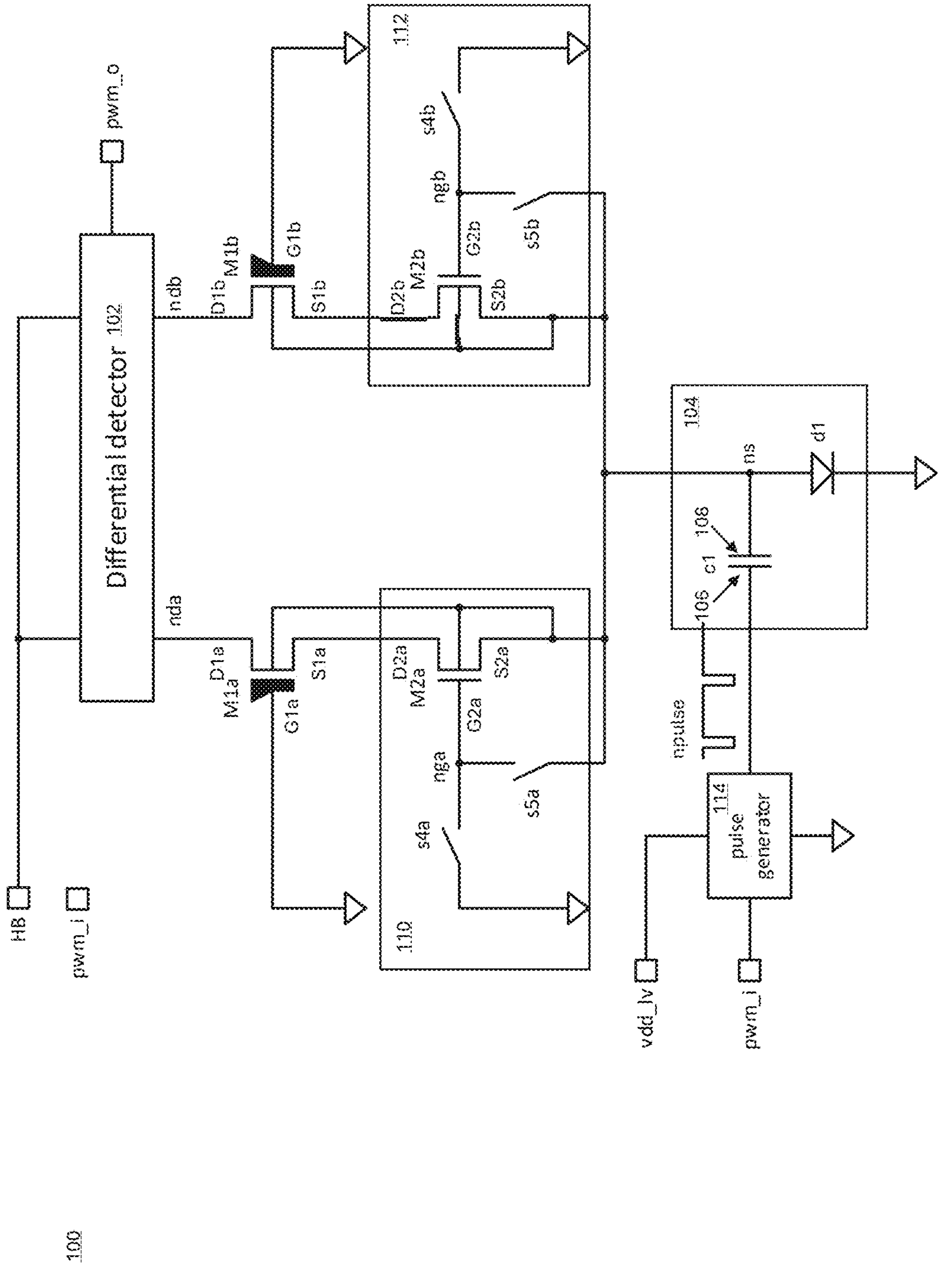
FIG. 3 illustrates a circuit schematic of a level-up shifter, according to another embodiment.

FIG. 3 illustrates a diode-based embodiment of the level shifter 100. In FIG. 3, the circuit 104 of the level shifter 100 with the common capacitor c1 includes a common diode d1 and omits the common switch network s1-s3. The anode of the common diode d1 is electrically connected to the source S2*a*, S2*b* of the first and the second additional switch devices M2*a*, M2*b*. The cathode of the common diode d1 is electrically connected to ground. The common capacitor c1 has a first terminal 106 to which a negative pulse signal 'npulse' derived from the digital input signal pwm_i by a pulse generator 114 is applied. The second terminal 108 of the common capacitor c1 is electrically connected to the source S2*a*, S2*b* of the first and the additional second switch devices M2*a*, M2*b* and the anode of the common diode d1.

Figure 4:
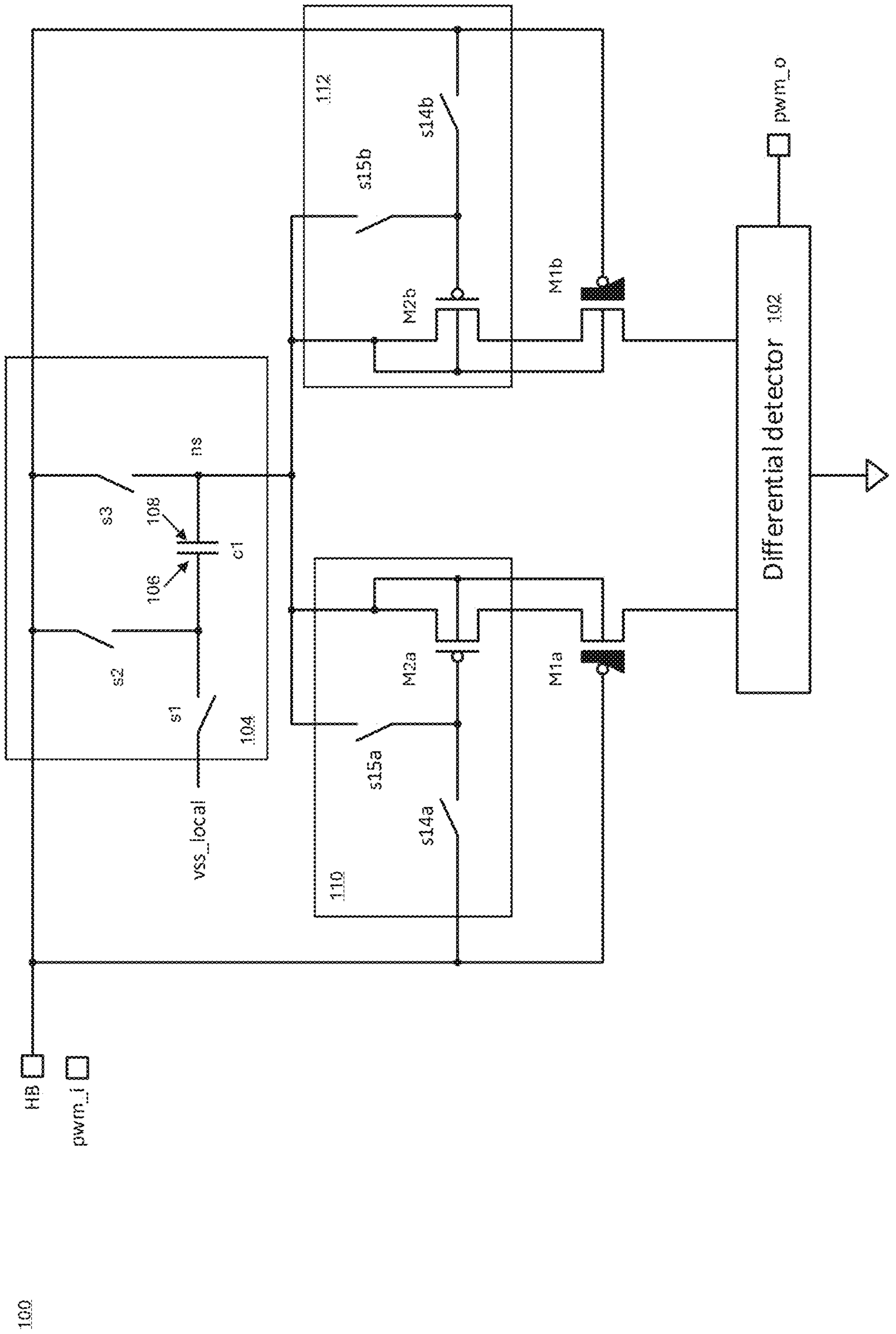
FIG. 4 illustrates a circuit schematic of a level-down shifter, according to an embodiment.

FIG. 4 illustrates a circuit schematic of the level shifter 100, according to another embodiment. The embodiment shown in FIG. 4 is similar to the embodiment shown in FIGS. 1A and 2. In FIG. 4, the level shifter 100 is a down level shifter meaning that the level shifter 100 translates the digital signal pwm_i input to the level sifter 100 to a lower voltage level. In the down level shifter case, the differential detector 102 is coupled between ground and the first and the second transistors M1*a*, M1*b*, the first and the second transistors M1*a*, M1*b* are PMOS (p-channel metal-oxide-semiconductor) devices coupled between the differential detector 102 and the bootstrap node HB, and the additional switch devices M2*a*, M2*b* of the gate potential switch networks 110, 112 are also PMOS devices. The first switch device s1 of the common switch network s1-s3 is electrically connected between a first local ground reference vss_local and the first terminal 106 of the common capacitor c1. The second switch device s2 of the common switch network s1-s3 is electrically connected between the first terminal 106 of the common capacitor c1 and the bootstrap node HB. The third switch device s3 of the common network s1-s3 is electrically connected between the second terminal 108 of the common capacitor c1 and the bootstrap node HB. The differential detector 102 translates the digital input signal pwm_i to a lower voltage level based on the differential current between the first transistor M1*a* and the second transistor M1*b*.

Figure 5:
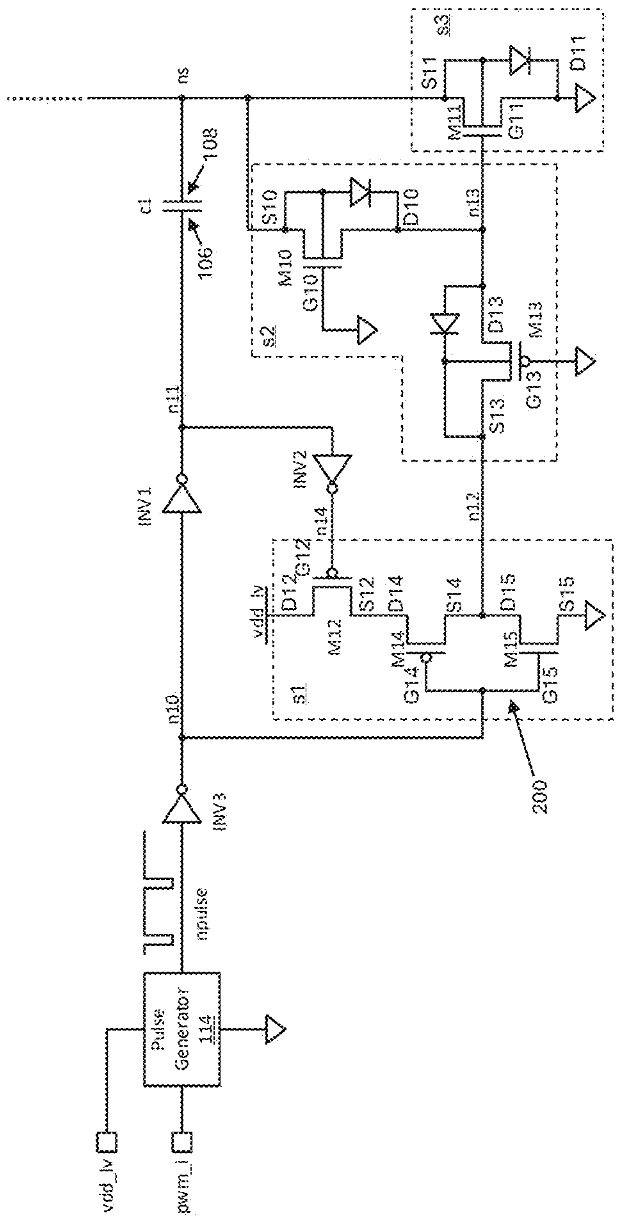
FIG. 5 illustrates a circuit schematic of a common switch network included in the level-up shifter, according to an embodiment.

FIG. 5 illustrates an embodiment of the common switch network s1-s3 for the up-level shifter embodiment. In FIG. 5, the first switch device s1 of the common switch network s1-s3 includes a first PMOS transistor M12 having a positive pulse gate input G12 via inverter INV2 electrically connected to the first terminal 106 of the common capacitor c1, a drain D12 electrically connected to the DC supply voltage vdd_lv, and a source S12. The first switch device s1 in FIG. 5 also includes a first inverter 200 formed by a second PMOS transistor M14 and a first NMOS transistor M15. The first inverter 200 has a positive pulse input via inverter INV3 which is applied to the gate G14 of the second PMOS transistor M14 and to the gate G15 of the first NMOS transistor M15. The drain D14 of the second PMOS transistor M14 is electrically coupled to the source S12 of the first PMOS transistor M12. The source S15 of the first NMOS transistor M15 is grounded.

The second switch device s2 of the common switch network s1-s3 in FIG. 5 includes a second NMOS transistor M10 having a grounded gate input G10, a source S10 electrically connected to the source S1 of the first transistor M1*a* and the second terminal 108 of the common capacitor c1, and a drain D10. The second switch device s2 in FIG. 5 also includes a third PMOS transistor M13 having a grounded gate input G13, a source S13 electrically connected to the output of the first inverter 200, and a drain D13 electrically connected to the drain D10 of the second NMOS transistor M10.

The third switch device s3 of the common switch network s1-s3 in FIG. 5 includes a third NMOS transistor M11 having a gate G11 electrically connected to the drain D13 of the third PMOS transistor P13 and the drain D10 of the second NMOS transistor M10, a source S11 electrically connected to the source S1 of the first transistor M1, and a drain D11 electrically connected to ground.

Figure 6:
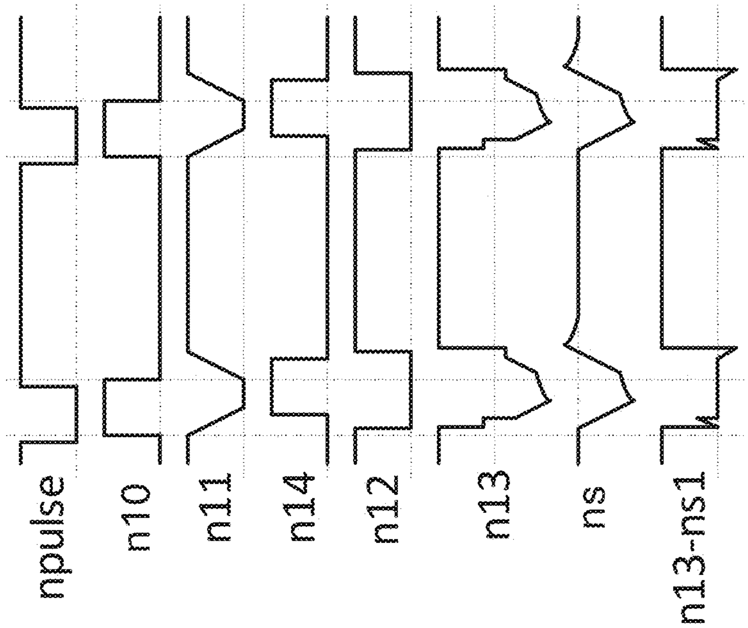
FIG. 6 illustrates various waveforms associated with the operation of the level-up shifter of FIG. 5.

FIG. 6 illustrates various waveforms associated with the operation of the up level shifter implementation shown in FIG. 5. The pulse generator 114 generates the negative pulse output npulse based on the digital signal pwm_i input to the level shifter 100. In steady state, the negative pulse output of the pulse generator 114 is fixed at a logic 1 level and node n11 is at the DC supply voltage vdd_lv to charge the common capacitor c1. Ground is provided to common node ns by the third NMOS transistor M11 of the third switch device s3. The gate G11 of the third NMOS transistor M11 is coupled to node n13 which is at the DC supply voltage vdd_lv delivered through the third PMOS transistor M13 of the second switch device s2 from node n12. The potential of node n12 is defined by the potential of node n10 and node n11 sensed by inverter INV2 which controls node n14.

When a negative edge appears at the output of the pulse generator 114, node n10 moves up which causes node n12 to move immediately down and thus also move node n13 down to around a threshold voltage Vt above ground (until transistor M13 allows it). This causes the third NMOS transistor M11 of the third switch device s3 to be nearly switched OFF. At this moment, node n13 became high ohmic and common node ns becomes undriven and defined only by the charge state of the common capacitor c1 in relation to node n11. Switching transistor M11 OFF before the movement of the common node ns prevents the common capacitor c1 from unwanted discharging by transistor M11 during movement of node ns below ground potential.

The moving of node n10 up also causes node n11 to move slowly down because of engaging current on the first transistor M1*a*. The common capacitor c1 forces the common node ns to follow the movement of node n11, but node ns moves down from ground potential to a negative value. As soon as node ns reaches a threshold voltage Vt below the ground, the second NMOS transistor M10 of the second switch device s2 starts to conduct and connects together nodes ns1 and n13, forcing the third NMOS transistor M11 of the third switch device s3 to remain OFF during the whole transition.

In this state, the common capacitor c1 delivers charge to the source S1*a* of the first transistor M1*a* from node n11 which is kept at ground potential by inverter INV1. Charge on the common capacitor c1 decays, causing the common node ns to slowly move up toward ground potential. The charge delivered by the common capacitor c1 is sufficient to be detected on the bootstrap node HB domain. The bootstrap node HB domain is provided enough time to reliably detect the pulse while at the same time the pulse width is reduced as much as possible to reduce power consumption.

When the digital signal pwm_i input to the level shifter 100 begins a rising edge, the pulse output npulse of the pulse generator 114 finishes the negative pulse. Node n10 then moves down, causing node n11 to begin moving up. Node ns follows node n11 up while the third NMOS transistor M11 of the third switch device s3 is kept OFF (transistor M10 keeps node n13 connected to node ns1). When node n11 moves high enough, inverter INV2 detects this condition and moves node n14 down which causes an upward of node n12. Node n13 starts to follow node n12 as soon as the node n12 voltage exceeds the threshold voltage Vt of the third PMOS transistor M13 of the second switch device s2. This leads to the enabling of transistor M11, which provides a path for the common capacitor c1 to recharge via inverter INV1 and transistor M11. The process returns to the initial position and is then ready to be repeated.

Figure 7:
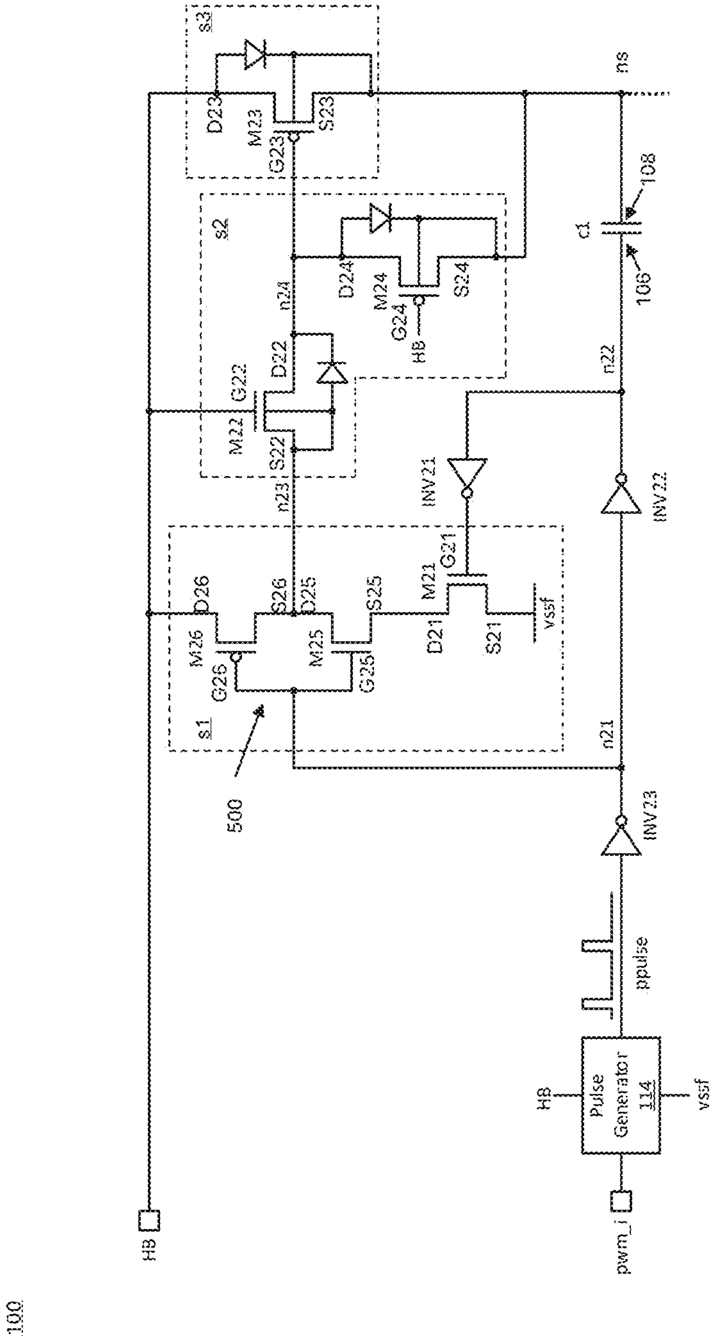
FIG. 7 illustrates a circuit schematic of a common switch network included in the level-down shifter, according to an embodiment.

FIG. 7 illustrates the same circuit as FIG. 5, but implemented as a level-down level shifter. In FIG. 7, the pulse generator 114 generates a positive pulse output 'ppulse' based on the digital signal pwm_i input to the level shifter 100. Also, the first switch device s1 of the common switch network s1-s3 includes a first NMOS transistor M21 having a negative pulse gate input G21 via inverter INV21 electrically connected to the first terminal 106 of the common capacitor c1, a source S21 electrically connected to a first local ground reference vssf, and a drain D21. The first switch device s1 also includes a first inverter 500 formed by a second NMOS transistor M25 and a first PMOS transistor M26. The first inverter 500 has a negative pulse input via inverter INV23 which is applied to the gate G25 of the second NMOS transistor M25 and to the gate G25 of the first PMOS transistor M26. The source S25 of the second NMOS transistor M25 is electrically coupled to the drain D21 of the first NMOS transistor M21. The drain D26 of the first PMOS transistor M26 is electrically connected to the bootstrap node HB.

The second switch device s2 of the common switch network s1-s3 in FIG. 5 includes a second PMOS transistor M24 having a gate G24 electrically connected to the bootstrap node HB, a source S24 electrically connected to the second terminal 108 of the common capacitor c1, and a drain D24. The second switch device s2 in FIG. 5 also includes a third NMOS transistor M22 having a gate G22 electrically connected to the bootstrap node HB, a source S22 electrically connected to the output of the first inverter 500, and a drain D22 electrically connected to the drain D24 of the second PMOS transistor M24.

The third switch device s3 of the common switch network s1-s3 in FIG. 5 includes a third PMOS transistor M23 having a gate G23 electrically connected to the drain D22 of the third NMOS transistor M22 and the drain D24 of the second PMOS transistor M24, a source S23 electrically connected to the second terminal 108 of the common capacitor c1, and a drain D23 electrically connected to the bootstrap node HB.

Figure 8:
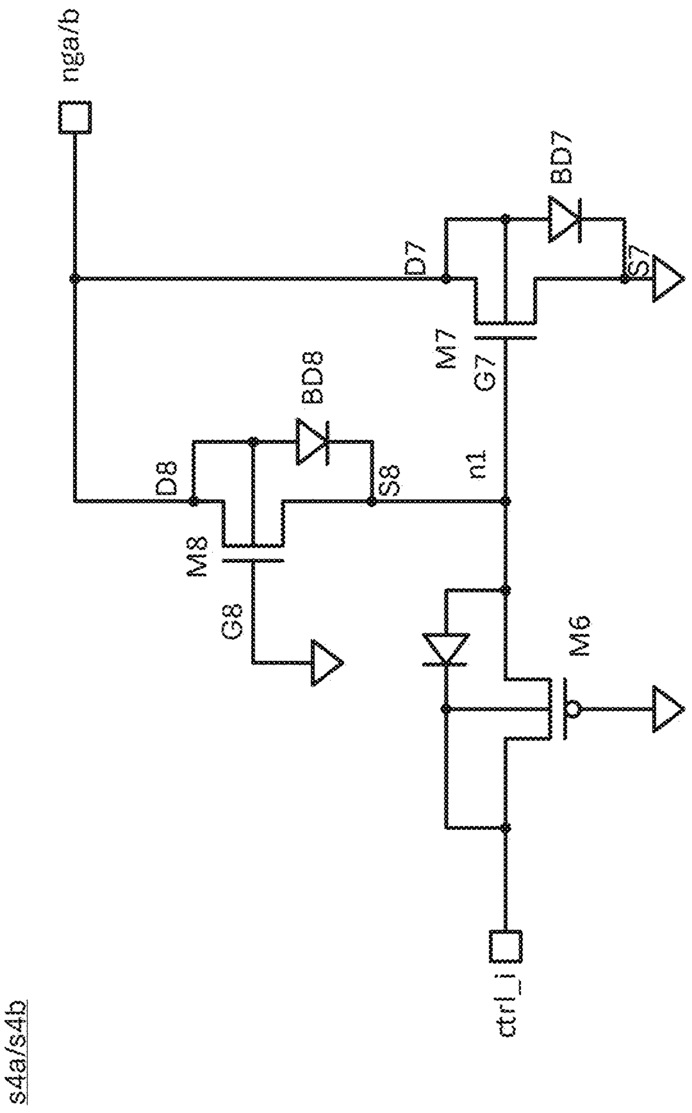
FIG. 8 illustrates a circuit schematic of a switch device included in a gate potential switch network of the level shifter, according to an embodiment.

FIG. 8 illustrates an embodiment of the first switch device s4*a*, 24*b* included in both gate potential switch networks 110, 112 of the level shifter 100. In FIG. 8, the first switch device s4*a*, 24*b* of each gate potential switch network 110, 112 includes a first NMOS transistor M8 having a body diode BD8, a grounded gate G8, a drain D8 electrically connected to the corresponding gate node nga/ngb, and a source S8. Both first switch devices s4*a*, 24*b* also include a second NMOS transistor M7 having a body diode BD7, a gate G7 electrically connected to the source S8 of the first NMOS transistor M8 at node n1, a drain D8 electrically connected to the corresponding gate node nga/ngb, and a grounded source S7. Both first switch devices s4*a*, 24*b* further include a first PMOS transistor M6 having a body diode M6, a grounded gate G6, a drain D6 electrically connected to a control input ctrl_i, and a source S6 electrically connected to the source S8 of the first NMOS transistor M8 and the gate G7 of the second NMOS transistor M7 at node n1. The control input ctrl_i determines whether the first switch device s4*a*, 24*b* is on or off. The control input ctrl_i for the first switch devices s4*a*, 24*b* are complementary such that either the left side or the right side of the level shifter 100 is active at a time, as previously explained herein in connection with the latching functionality of the differential detector 102.

Figure 9:
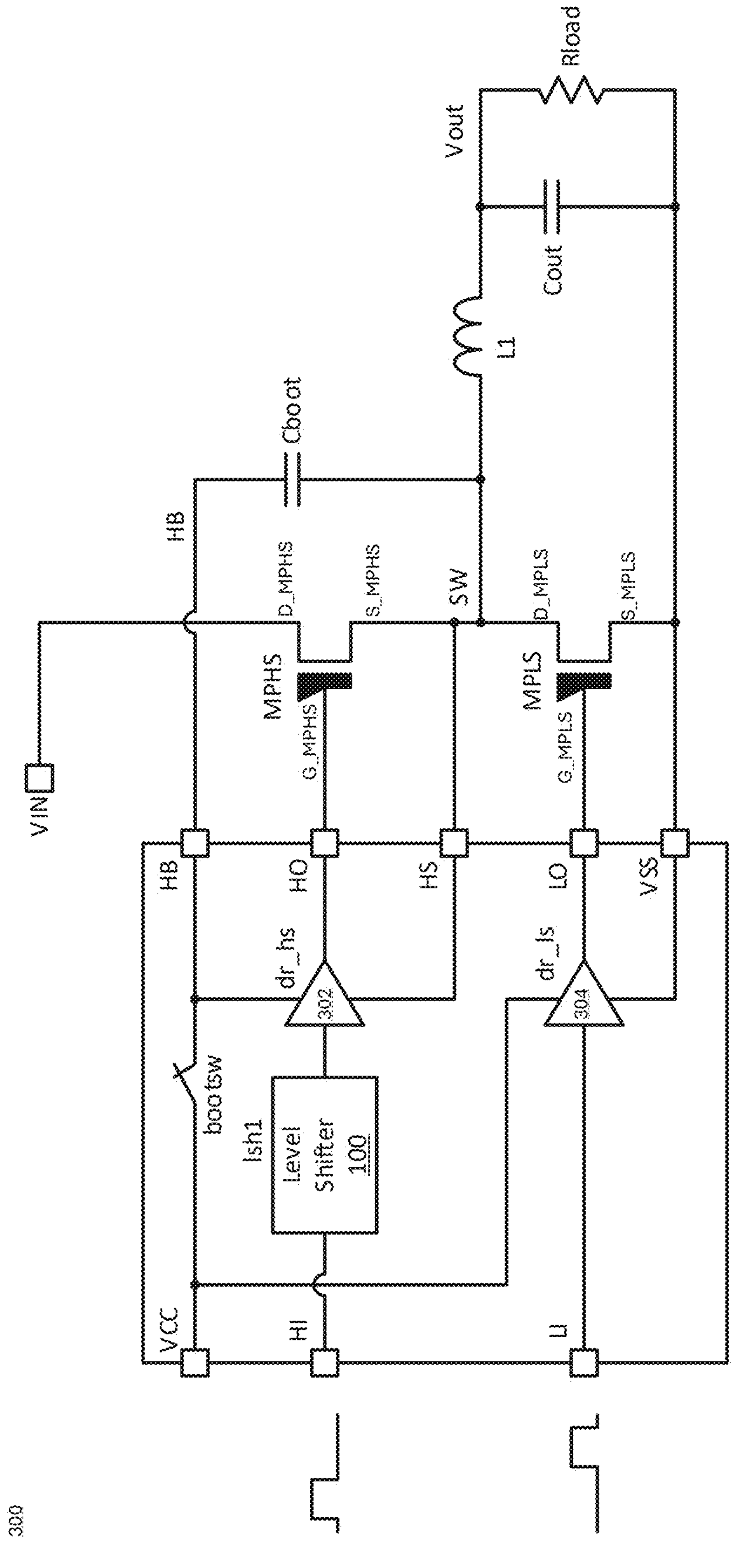
FIG. 9 illustrates an embodiment of a power converter that includes the level-up or level-down shifter described herein.

FIG. 9 illustrates an embodiment of a power converter 300 such as a half bridge converter, a full bridge converter, etc. that includes the level shifter 100 described herein. The power converter 300 also includes a high-side power switch device MPHS and a (floating) gate driver 302 for driving a gate G_MPHS of the high-side power switch device MPHS. The level shifter 100 translates a digital signal HI input to the level shifter 100 to a voltage domain dr_hs of the high-side gate driver 302.

As explained herein, the level shifter 100 includes: a differential detector 102; a first transistor M1*a* having a drain D1*a* electrically connected to a first node nda of the differential detector 102, a gate G1*a*, and a source S1*a*; a second transistor M1*b* having a drain D1*b* electrically connected to a second node ndb of the differential detector 102, a gate G1*b*, and a source S1*b*; and a circuit 104 configured to simultaneously apply a same voltage to the source S1*a*, S1*b* of the first and the second transistors M1*a*, M1*b* based on a digital signal input pwm_i to the level shifter 100. The circuit 104 that simultaneously applies the same voltage to the source S1*a*, S1*b* of the first and the second transistors M1*a*, M1*b* of the level shifter 100 includes, e.g., a common capacitor c1 having a first terminal 106 and a second terminal 108, a first switch device s1 electrically connected between a first DC supply voltage vdd_lv or a local ground reference and the first terminal 106 of the common capacitor c1, a second switch device s2 electrically connected between the first terminal 106 of the common capacitor c1 and ground (up level shifter case) or a bootstrap node HB (down level shifter case), and a third switch device s3 electrically connected between the second terminal 108 of the common capacitor c1 and ground (up level shifter case) or the bootstrap node HB (down level shifter case). The second terminal 108 of the common capacitor c1 is electrically connected to the source S1*a*, S1*b* of the first and the second transistors M1*a*, M1*b* of the level shifter 100. The differential detector 102 translates the digital signal pwm_i to a voltage domain of the high-side gate driver 302 based on the differential current between the first transistor M1*a* and the second transistor M1*b* of the level shifter 100.

In FIG. 9, the power converter 300 has a buck converter topology. However, the power converter 300 may have a different type of power converter topology such as boost, buck-boost, etc. In the case of a buck converter, the power converter 300 also includes a low-side power switch device MPLS electrically connected to the high-side power switch device MPHS in a half bridge configuration. More particularly, the drain D_MPLS of the low-side power switch device MPLS is electrically connected to the source S_MPHS of the high-side power switch device MPHS at a switch node SW, with the source S_MPLS of the low-side power switch device MPLS being electrically connected to a reference potential VSS such as ground and the drain S_MPHS of the high-side power switch device MPHS being electrically connected to a voltage source VIN. A gate driver 304 is provided for driving the gate G_MPLS of the low-side power switch device MPLS. In one embodiment, the drivers 302, 304 are GaN (gallium nitride) drivers.

An inductor L1 is electrically connected to the switch node SW between the low-side power switch device MPLS and the high-side power switch device MPHS. A bootstrap capacitor Cboot is electrically connected between the switch node SW the bootstrap node HB which provides a supply voltage to the gate driver 302 for the high-side power switch device MPHS. The load powered by the power converter 300 is illustrated as a resistor Rload in FIG. 9, with a capacitor Cout that stabilizes the voltage Vout applied to the load Rload. A switch device 'bootsw' recharges the bootstrap capacitor Cboot via a voltage source VCC for the high side gate driver 302.

In the up-level shifter case, the differential detector 102 is coupled between the bootstrap node HB and the first and the second transistors M1*a*, M1*b* of the up level shifter 100, the first and the second transistors M1*a*, M1*b* of the up level shifter 100 are coupled between the differential detector 102 and ground, and the differential detector 102 translates the digital input signal HI to a higher voltage level based on the differential current between the first transistor M1*a* and the second transistor M1*b* of the up level shifter 100.

In the down-level shifter case, the differential detector 102 is coupled between ground and the first and the second transistors M1*a*, M1*b* of the down level shifter 100, the first and the second transistors M1*a*, M1*b* of the down level shifter 100 are coupled between the differential detector 102 and the bootstrap node HB, and the differential detector 102 translates the digital input signal HI to a lower voltage level based on the differential current between the first transistor M1*a* and the second transistor M1*b* of the down level shifter 100.

As shown in FIG. 1A, the circuit 104 that simultaneously applies the same voltage to the source S1*a*, S1*b* of the first and the second transistors M1*a*, M1*b* of the level shifter 100 may include a common (shared) capacitor c1 and a common (shared) switch network s1-s3. In response to a first transition in the digital input signal HI for the high-side gate driver 302, the first gate potential switch network 110 of the level shifter activates the left hand side of the level shifter 100, which includes first transistor M1*a*. Since the common switch network s1-s3 and the common capacitor c1 apply the same voltage to the source S1*a*, S1*b* of the first and second transistors M1*a*, M1*b* at the same time, a negative voltage is applied to the source S1*a* of the first transistor M1*a*. After the first transition in the digital input signal HI for the high-side gate driver 302, the common switch network s1-s3 pre-charges the common capacitor c1 for the next (second) transition in the digital input signal HI.

In response to the second transition in the digital input signal HI for the high-side gate driver 302 opposite the first transition, the second gate potential switch network 112 of the level shifter activates the right hand side of the level shifter 100, which includes second transistor M1*b*. As explained above, the common switch network s1-s3 and the common capacitor c1 apply the same voltage to the source S1*a*, S1*b* of the first and second transistors M1*a*, M1*b* at the same time. As such, a negative voltage is applied to the source S1*b* of the second transistor M1*b* in response to the second transition in the digital input signal HI for the high-side gate driver 302. After the second transition in the digital input signal HI for the high-side gate driver 302, the common switch network s1-s3 pre-charges the common capacitor c1 the next (first) transition in the digital input signal HI. This allows the differential detector 102 to translate the digital input signal HI for the high-side gate driver 302 to a different voltage level (pwm_o) based on the differential current between the first transistor M1*a* and the second transistor M1*b* of the level shifter 100. For down-level shifting, the level shifter 100 can be used in case of control on high side and level shifting from the VIN domain to the low side. That is, the level shifter 100 can be connected to the input of the low-side gate driver 304.

Although the present disclosure is not so limited, the following numbered examples demonstrate one or more aspects of the disclosure.

Example 1. A level shifter, comprising: a differential detector; a first transistor having a drain electrically connected to a first node of the differential detector, a gate, and a source; a second transistor having a drain electrically connected to a second node of the differential detector, a gate, and a source; and a circuit configured to simultaneously apply a same voltage to the source of the first and the second transistors based on a digital signal input to the level shifter, wherein the differential detector is configured to translate the digital signal to a different voltage level based on a differential current between the first and the second transistors.

Example 2. The level shifter of example 1, wherein the circuit comprises a common capacitor and a common switch network, wherein in response to a transition in the digital signal, the common switch network is configured to connect the common capacitor to the source of the first and the second transistors such that a negative voltage is applied to the source of the first and the second transistors at the same time, wherein after the transition in the digital signal, the common switch network is configured to pre-charge the common capacitor for a next transition in the digital signal.

Example 3. The level shifter of example 2, wherein the common switch network comprises: a first switch device electrically connected between a first DC supply voltage or a local ground reference and a first terminal of the common capacitor; a second switch device electrically connected between the first terminal of the common capacitor and ground or a bootstrap node; and a third switch device electrically connected between a second terminal of the common capacitor and ground or the bootstrap node, wherein the second terminal of the common capacitor is electrically connected to the source of the first and the second transistors.

Example 4. The level shifter of example 3, wherein the second switch device is configured to turn on in response to the transition in the digital signal, and the first switch device and the third switch device are both configured to be off when the second switch device is on, wherein the second switch device is configured to turn off after a predefined time from the transition in the digital signal, and the first switch device and the third switch device are both configured to be on when the second switch device is off.

Example 5. The level shifter of any of examples 1 through 4, wherein the differential detector is coupled between a bootstrap node and the first and the second transistors, wherein the first and the second transistors are coupled between the differential detector and ground, and wherein the differential detector is configured to translate the digital signal to a higher voltage level based on the differential current between the first and the second transistors.

Example 6. The level shifter of any of examples 1 through 4, wherein the differential detector is coupled between ground and the first and the second transistors, wherein the first and the second transistors are coupled between the differential detector and a bootstrap node, and wherein the differential detector is configured to translate the digital signal to a lower voltage level based on the differential current between the first and the second transistors.

Example 7. The level shifter of any of examples 1 through 6, further comprising: a first switch network configured to control an electric potential at the gate of the first transistor; and a second switch network configured to control an electric potential at the gate of the second transistor.

Example 8. The level shifter of example 7, wherein the first switch network comprises a first switch device electrically connected between ground and the gate of the first transistor and a second switch device electrically connected between the gate and the source of the first transistor, and wherein the second switch network comprises a third switch device electrically connected between ground and the gate of the second transistor and a fourth switch device electrically connected between the gate and the source of the second transistor.

Example 9. The level shifter of any of examples 1 through 8, further comprising: a first switch device electrically connected between the source of the first transistor and a common capacitor of the circuit; a second switch device electrically connected between the source of the second transistor and the common capacitor; a first switch network configured to control an electric potential at a gate of the first switch device; and a second switch network configured to control an electric potential at a gate of the second switch device.

Example 10. The level shifter of example 9, wherein a common diode of the circuit has an anode electrically connected to a source of the first and the second switch devices and a cathode electrically connected to ground, wherein the common capacitor has a first terminal to which a pulse signal derived from the digital signal is applied and a second terminal electrically connected to the source of the first and the second switch devices and the anode of the common diode.

Example 11. A level shifter, comprising: a differential detector; a first transistor having a drain electrically connected to a first node of the differential detector, a gate, and a source; a second transistor having a drain electrically connected to a second node of the differential detector, a gate, and a source; a common capacitor having a first terminal and a second terminal; a first switch device electrically connected between a first DC supply voltage or a local ground reference and the first terminal of the common capacitor; a second switch device electrically connected between the first terminal of the common capacitor and ground or a bootstrap node; and a third switch device electrically connected between the second terminal of the common capacitor and ground or the bootstrap node, wherein the second terminal of the common capacitor is electrically connected to the source of the first and the second transistors.

Example 12. The level shifter of example 11, wherein the first switch device comprises: a first PMOS transistor having a positive pulse gate input electrically connected to the first terminal of the common capacitor, a drain electrically connected to the first DC supply voltage, and a source; and a first inverter formed by a second PMOS transistor and a first NMOS transistor, the first inverter having a positive pulse input, a drain of the second PMOS transistor being electrically coupled to the source of the first PMOS transistor, a source of the first NMOS transistor being grounded, wherein the second switch device comprises: a second NMOS transistor having a grounded gate input, a source electrically connected to the source of the first transistor and the second terminal of the common capacitor, and a drain; and a third PMOS transistor having a grounded gate input, a source electrically connected to an output of the first inverter, and a drain electrically connected to the drain of the second NMOS transistor, wherein the third switch device comprises: a third NMOS transistor having a gate electrically connected to the drain of the third PMOS transistor and the drain of the second NMOS transistor, a source electrically connected to the source of the first transistor, and a drain electrically connected to ground.

Example 13. The level shifter of example 11, wherein the first switch device comprises: a first NMOS transistor having a negative pulse gate input electrically connected to the first terminal of the common capacitor, a source electrically connected to a local ground reference, and a drain; and a first inverter formed by a second NMOS transistor and a first PMOS transistor, the first inverter having a negative pulse input, a source of the second NMOS transistor being electrically coupled to the drain of the first NMOS transistor, a drain of the first PMOS transistor being electrically connected to a bootstrap node, wherein the second switch device comprises: a second PMOS transistor having a gate electrically connected to the bootstrap node, a source electrically connected to the second terminal of the common capacitor, and a drain; and a third NMOS transistor having a gate electrically connected to the bootstrap node, a source electrically connected to an output of the first inverter, and a drain electrically connected to the drain of the second PMOS transistor, wherein the third switch device comprises: a third PMOS transistor having a gate electrically connected to the drain of the third NMOS transistor and the drain of the second PMOS transistor, a source electrically connected to the second terminal of the common capacitor, and a drain electrically connected to the bootstrap node.

Example 14. The level shifter of any of examples 11 through 13, further comprising: a first switch network configured to control an electric potential at the gate of the first transistor; and a second switch network configured to control an electric potential at the gate of the second transistor.

Example 15. A power converter, comprising: a high-side power switch device; a gate driver configured to drive a gate of the high-side power switch device; and a level shifter, wherein the level shifter comprises: a differential detector; a first transistor having a drain electrically connected to a first node of the differential detector, a gate, and a source; a second transistor having a drain electrically connected to a second node of the differential detector, a gate, and a source; and a circuit configured to simultaneously apply a same voltage to the source of the first and the second transistors based on a digital signal input to the level shifter, wherein the differential detector is configured to translate the digital signal to a voltage domain of the gate driver based on a differential current between the first transistor and the second transistor.

Example 16. The power converter of example 15, further comprising: a low-side power switch device electrically connected to the high-side power switch device in a half bridge configuration; an inductor electrically connected to a switch node between the low-side power switch device and the high-side power switch device; and a capacitor electrically connected between the switch node and a bootstrap node that provides a supply voltage to the gate driver for the high-side power switch device.

Example 17. The power converter of example 16, wherein the differential detector is coupled between the bootstrap node and the first and the second transistors of the level shifter, wherein the first and the second transistors of the level shifter are coupled between the differential detector and ground, and wherein the differential detector is configured to translate the digital signal to a higher voltage level based on the differential current between the first transistor and the second transistor of the level shifter.

Example 18. The power converter of example 16, wherein the differential detector is coupled between ground and the first and the second transistors of the level shifter, wherein the first and the second transistors of the level shifter are coupled between the differential detector and the bootstrap node, and wherein the differential detector is configured to translate the digital signal to a lower voltage level based on the differential current between the first transistor and the second transistor of the level shifter.

Example 19. The power converter of any of examples 15 through 18, wherein the circuit of the level shifter comprises a common capacitor and a common switch network, wherein in response to a transition in the digital signal, the common switch network is configured to connect the common capacitor to the source of the first and the second transistors such that a negative voltage is applied to the source of the first and the second transistors at the same time, wherein after the transition in the digital signal, the common switch network is configured to pre-charge the common capacitor for a next transition in the digital signal.

Example 20. The power converter of example 19, wherein the common switch network of the level shifter comprises: a first switch device electrically connected between a first DC supply voltage or a local ground reference and a first terminal of the common capacitor; a second switch device electrically connected between the first terminal of the common capacitor and ground or a bootstrap node; and a third switch device electrically connected between a second terminal of the common capacitor and ground or the bootstrap node, wherein the second terminal of the common capacitor is electrically connected to the source of the first and the second transistors.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A level shifter, comprising:

a differential detector;

a first transistor having a drain electrically connected to a first node of the differential detector, a gate, and a source;

a second transistor having a drain electrically connected to a second node of the differential detector, a gate, and a source; and a circuit configured to simultaneously apply a same voltage to the source of the first and the second transistors based on a digital signal input to the level shifter, wherein the differential detector is configured to translate the digital signal to a different voltage level based on a differential current between the first and the second transistors.

2. The level shifter of claim 1, wherein the circuit comprises a common capacitor and a common switch network, wherein in response to a transition in the digital signal, the common switch network is configured to connect the common capacitor to the source of the first and the second transistors such that a negative voltage is applied to the source of the first and the second transistors at the same time, wherein after the transition in the digital signal, the common switch network is configured to pre-charge the common capacitor for a next transition in the digital signal.

3. The level shifter of claim 2, wherein the common switch network comprises:

a first switch device electrically connected between a first DC supply voltage or a local ground reference and a first terminal of the common capacitor;

a second switch device electrically connected between the first terminal of the common capacitor and ground or a bootstrap node; and a third switch device electrically connected between a second terminal of the common capacitor and ground or the bootstrap node, wherein the second terminal of the common capacitor is electrically connected to the source of the first and the second transistors.

4. The level shifter of claim 3, wherein the second switch device is configured to turn on in response to the transition in the digital signal, and the first switch device and the third switch device are both configured to be off when the second switch device is on, wherein the second switch device is configured to turn off after a predefined time from the transition in the digital signal, and the first switch device and the third switch device are both configured to be on when the second switch device is off.

5. The level shifter of claim 1, wherein the differential detector is coupled between a bootstrap node and the first and the second transistors, wherein the first and the second transistors are coupled between the differential detector and ground, and wherein the differential detector is configured to translate the digital signal to a higher voltage level based on the differential current between the first and the second transistors.

6. The level shifter of claim 1, wherein the differential detector is coupled between ground and the first and the second transistors, wherein the first and the second transistors are coupled between the differential detector and a bootstrap node, and wherein the differential detector is configured to translate the digital signal to a lower voltage level based on the differential current between the first and the second transistors.

7. The level shifter of claim 1, further comprising:

a first switch network configured to control an electric potential at the gate of the first transistor; and a second switch network configured to control an electric potential at the gate of the second transistor.

8. The level shifter of claim 7, wherein the first switch network comprises a first switch device electrically connected between ground and the gate of the first transistor and a second switch device electrically connected between the gate and the source of the first transistor, and wherein the second switch network comprises a third switch device electrically connected between ground and the gate of the second transistor and a fourth switch device electrically connected between the gate and the source of the second transistor.

9. The level shifter of claim 1, further comprising:

a first switch device electrically connected between the source of the first transistor and a common capacitor of the circuit;

a second switch device electrically connected between the source of the second transistor and the common capacitor;

a first switch network configured to control an electric potential at a gate of the first switch device; and a second switch network configured to control an electric potential at a gate of the second switch device.

10. The level shifter of claim 9, wherein a common diode of the circuit has an anode electrically connected to a source of the first and the second switch devices and a cathode electrically connected to ground, wherein the common capacitor has a first terminal to which a pulse signal derived from the digital signal is applied and a second terminal electrically connected to the source of the first and the second switch devices and the anode of the common diode.

11. A level shifter, comprising:

a differential detector;

a first transistor having a drain electrically connected to a first node of the differential detector, a gate, and a source;

a second transistor having a drain electrically connected to a second node of the differential detector, a gate, and a source;

a common capacitor having a first terminal and a second terminal;

a first switch device electrically connected between a first DC supply voltage or a local ground reference and the first terminal of the common capacitor;

a second switch device electrically connected between the first terminal of the common capacitor and ground or a bootstrap node; and a third switch device electrically connected between the second terminal of the common capacitor and ground or the bootstrap node, wherein the second terminal of the common capacitor is electrically connected to the source of the first and the second transistors.

12. The level shifter of claim 11, wherein the first switch device comprises:

a first PMOS transistor having a positive pulse gate input electrically connected to the first terminal of the common capacitor, a drain electrically connected to the first DC supply voltage, and a source; and a first inverter formed by a second PMOS transistor and a first NMOS transistor, the first inverter having a positive pulse input, a drain of the second PMOS transistor being electrically coupled to the source of the first PMOS transistor, a source of the first NMOS transistor being grounded, wherein the second switch device comprises:

a second NMOS transistor having a grounded gate input, a source electrically connected to the source of the first transistor and the second terminal of the common capacitor, and a drain; and a third PMOS transistor having a grounded gate input, a source electrically connected to an output of the first inverter, and a drain electrically connected to the drain of the second NMOS transistor, wherein the third switch device comprises:

a third NMOS transistor having a gate electrically connected to the drain of the third PMOS transistor and the drain of the second NMOS transistor, a source electrically connected to the source of the first transistor, and a drain electrically connected to ground.

13. The level shifter of claim 11, wherein the first switch device comprises:

a first NMOS transistor having a negative pulse gate input electrically connected to the first terminal of the common capacitor, a source electrically connected to a local ground reference, and a drain; and a first inverter formed by a second NMOS transistor and a first PMOS transistor, the first inverter having a negative pulse input, a source of the second NMOS transistor being electrically coupled to the drain of the first NMOS transistor, a drain of the first PMOS transistor being electrically connected to a bootstrap node, wherein the second switch device comprises:

a second PMOS transistor having a gate electrically connected to the bootstrap node, a source electrically connected to the second terminal of the common capacitor, and a drain; and a third NMOS transistor having a gate electrically connected to the bootstrap node, a source electrically connected to an output of the first inverter, and a drain electrically connected to the drain of the second PMOS transistor, wherein the third switch device comprises:

a third PMOS transistor having a gate electrically connected to the drain of the third NMOS transistor and the drain of the second PMOS transistor, a source electrically connected to the second terminal of the common capacitor, and a drain electrically connected to the bootstrap node.

14. The level shifter of claim 11, further comprising:

a first switch network configured to control an electric potential at the gate of the first transistor; and a second switch network configured to control an electric potential at the gate of the second transistor.

15. A power converter, comprising:

a high-side power switch device;

a gate driver configured to drive a gate of the high-side power switch device; and a level shifter, wherein the level shifter comprises:

a differential detector;

a first transistor having a drain electrically connected to a first node of the differential detector, a gate, and a source;

a second transistor having a drain electrically connected to a second node of the differential detector, a gate, and a source; and a circuit configured to simultaneously apply a same voltage to the source of the first and the second transistors based on a digital signal input to the level shifter, wherein the differential detector is configured to translate the digital signal to a voltage domain of the gate driver based on a differential current between the first transistor and the second transistor.

16. The power converter of claim 15, further comprising:

a low-side power switch device electrically connected to the high-side power switch device in a half bridge configuration;

an inductor electrically connected to a switch node between the low-side power switch device and the high-side power switch device; and a capacitor electrically connected between the switch node and a bootstrap node that provides a supply voltage to the gate driver for the high-side power switch device.

17. The power converter of claim 16, wherein the differential detector is coupled between the bootstrap node and the first and the second transistors of the level shifter, wherein the first and the second transistors of the level shifter are coupled between the differential detector and ground, and wherein the differential detector is configured to translate the digital signal to a higher voltage level based on the differential current between the first transistor and the second transistor of the level shifter.

18. The power converter of claim 16, wherein the differential detector is coupled between ground and the first and the second transistors of the level shifter, wherein the first and the second transistors of the level shifter are coupled between the differential detector and the bootstrap node, and wherein the differential detector is configured to translate the digital signal to a lower voltage level based on the differential current between the first transistor and the second transistor of the level shifter.

19. The power converter of claim 15, wherein the circuit of the level shifter comprises a common capacitor and a common switch network, wherein in response to a transition in the digital signal, the common switch network is configured to connect the common capacitor to the source of the first and the second transistors such that a negative voltage is applied to the source of the first and the second transistors at the same time, wherein after the transition in the digital signal, the common switch network is configured to pre-charge the common capacitor for a next transition in the digital signal.

20. The power converter of claim 19, wherein the common switch network of the level shifter comprises:

a first switch device electrically connected between a first DC supply voltage or a local ground reference and a first terminal of the common capacitor;

a second switch device electrically connected between the first terminal of the common capacitor and ground or a bootstrap node; and a third switch device electrically connected between a second terminal of the common capacitor and ground or the bootstrap node, wherein the second terminal of the common capacitor is electrically connected to the source of the first and the second transistors.

* * * * *